(12) United States Patent  (10) Patent No.: US 8,576,319 B2
Kureta et al.  (45) Date of Patent: Nov. 5, 2013

(54) IMAGE SENSOR, SEMICONDUCTOR DEVICE AND IMAGE SENSING METHOD

(75) Inventors: Masatoshi Kureta, Ibaraki (JP); Masatoshi Arai, Ibaraki (JP); Takeharu Etoh, Osaka (JP); Konoe Etoh, Osaka (JP); Toshiaki Akino, Kyoto (JP)

(73) Assignees: Japan Atomic Energy Agency, Ibaraki (JP); Kinki University, Osaka (JP)

( * ) Notice: Subject to any disclaimer, the term of this patent is extended or adjusted under 35 U.S.C. 154(b) by 370 days.

(21) Appl. No.: 12/929,004

(22) Filed: Dec. 22, 2010

(65) Prior Publication Data

US 2011/0157448 A1 Jun. 30, 2011

(30) Foreign Application Priority Data

Dec. 25, 2009 (JP) ................. 2009-294755

(51) Int. Cl.
  *H04N 3/14* (2006.01)
  *H04N 5/335* (2011.01)
  *H04N 9/04* (2006.01)
(52) U.S. Cl.
  USPC ........... 348/315; 348/311; 348/316; 348/282; 348/298
(58) Field of Classification Search
  USPC .......................... 348/282, 298–299, 311–324
  See application file for complete search history.

(56) References Cited

U.S. PATENT DOCUMENTS 4,811,068 A * 3/1989 Kinoshita ...................... 257/232
4,897,728 A * 1/1990 Yamada ........................ 348/318
5,272,537 A * 12/1993 Watanabe ..................... 348/303

(Continued)

FOREIGN PATENT DOCUMENTS

EP 0315778 5/1989
JP H08-186242 A 7/1996
JP 2001-345441 12/2001

OTHER PUBLICATIONS

Kosonocky et al., "360×360-Element Very High Frame Rate Burst Image Sensor", ISSCC1996, Digest of Technical Papers, Feb. 9, 1996, pp. 182-183.

(Continued)

*Primary Examiner* — Chia-Wei A Chen
(74) *Attorney, Agent, or Firm* — Paul F. Neils, Esq.; Edwards Neils PLLC

(57) ABSTRACT

An image sensor and an image sensing method can obtain image signals with a high S/N ratio in a high-speed image pickup operation. Signal charges are input to input transfer stage 31 of CCD memory 30. Final transfer stage 32 is formed so as to be connected to the input transfer stage 31 and able to transfer signal charges to the input transfer stage 31. In an accumulation mode, read gate 42 and drain gate 40 are not turned on and the next transfer operation of the CCD memory 30 is conducted. The accumulated signal charges are transferred on a stage by stage basis and the signal charges obtained at the first image pickup timing are transferred again straightly to the input transfer stage 31. In this state, the signal charges obtained newly at photoelectric conversion section 20 at the next image pickup timing are injected into the input transfer stage 31 by way of input gate 21. As a result of this operation, the signal charges obtained at the last image pickup timing are added to the signal charges accumulated in the input transfer stage 31 so that integrated signal charges obtained by adding the two sets of signal charges are accumulated in the input transfer stage 31.

7 Claims, 9 Drawing Sheets

(56) References Cited

U.S. PATENT DOCUMENTS

| | | | | |
|---|---|---|---|---|
| 5,459,509 | A | * | 10/1995 | Monoi ............................ 348/248 |
| 7,190,400 | B2 | * | 3/2007 | Hynecek ........................ 348/317 |
| 7,432,971 | B2 | | 10/2008 | Takubo et al. |
| 7,705,901 | B2 | * | 4/2010 | Kobayashi ..................... 348/315 |
| 7,952,636 | B2 | * | 5/2011 | Ikeda et al. ................... 348/311 |
| 2002/0113888 | A1 | * | 8/2002 | Sonoda et al. ................. 348/315 |
| 2002/0191093 | A1 | * | 12/2002 | Hynecek ........................ 348/311 |
| 2003/0007087 | A1 | * | 1/2003 | Hakamata et al. ............. 348/370 |
| 2003/0234874 | A1 | * | 12/2003 | Takubo et al. .............. 348/229.1 |
| 2004/0046883 | A1 | * | 3/2004 | Suzuki ........................... 348/315 |
| 2007/0030373 | A1 | * | 2/2007 | Kobayashi et al. ........... 348/315 |
| 2007/0229691 | A1 | * | 10/2007 | Oshima et al. ................ 348/315 |

OTHER PUBLICATIONS

Etoh et al., "A CCD Image Sensor of 1M frames/s for Continuous Image Capturing of 103 Frames", ISSCC 2002, Digest of Technical Papers, Feb. 4, 2002, pp. 45-47.

Etoh et al., "Evolution of Ultra-High-Speed CCD Images", Plasma and Fusion Research, 2007, vol. 2, S1021, pp. 1-8.

Etoh et al., "Ultra-High-Speed Image Signal Accumulation Sensor", Sensors, 2010, vol. 10, pp. 4100-4113.

* cited by examiner (a)

(b)

(a)

(b)

(a)

(b)

(c)

IMAGE SENSOR, SEMICONDUCTOR DEVICE AND IMAGE SENSING METHOD

CROSS-REFERENCE TO RELATED APPLICATIONS

The present application claims priority from Japanese Patent Application No. 2009-294755, filed Dec. 25, 2009, the contents of which are herein incorporated by reference in their entirety.

BACKGROUND OF THE INVENTION

1. Field of the Invention

This invention relates to an image sensor and an image sensing method for acquiring a two-dimensional image. The present invention also relates to a semiconductor device having a CCD (charge coupled device).

2. Description of the Related Art

CCD image sensors and CMOS image sensors made from semiconductor are known as image sensors for converting a two-dimensional image formed by light focused by an optical image forming system into an electric signal and outputting the signal and such sensors are known to be widely used. A CCD image sensor generates image signals using a large number of pixels and reads them to the outside by sequentially transferring them by means of a CCD (charge coupled device). A CMOS image sensor sequentially scans pixels by means a CMOS switch and reads image signals to the outside. Most image sensors of the types under consideration are designed to operate at a frame rate of about 30 frames per second for ordinary moving pictures. On the other hand, there may be cases where a phenomenon continues only for a very short time and an ultrahigh image pickup speed of about a million frames per second is required to catch such a phenomenon. However, it takes certain time for a CCD or a CMOS switch to read image signals from many pixels to the outside and hence it is difficult for such an image sensor to operate at such a high speed. Therefore, there are known techniques for realizing such a high-speed image sensing operation by devising a particular arrangement for image sensors.

A method referred to as parallel/partial read out method is known as a method applicable to COD image sensors. With this method, a number of readout paths are provided and the read time necessary for reading image signals is reduced by thinning pixels when a high-speed pixel reading operation should be conducted to realize a high-speed image sensing operation. Image sensors having about 300,000 pixels and adapted to pick up images at a rate of 10,000 frames per second by using this method are commercially available.

Other known image sensing methods include an IS (in-situ storage) method. With this method, a large number of image signal recording elements are formed around the photoelectric conversion section of each pixel. The image signal recording elements temporarily store the image signals obtained by the photoelectric conversion section. Then, the image signal obtained by a single photoelectric conversion section in a short integration time can be stored in one of the image signal recording elements around the photoelectric conversion section. Thus, the image signals, each obtained in a short integration time, can be sequentially stored in the image signal recording elements. Subsequently, when an image sensing operation using a large number of frames ends (after storing image signals in all the image signal recording elements of a pixel), the image signals can be read to the outside. If the image signal reading operation takes a long time, the image signals can be read properly because the image signal recording elements store respective image signals. While the image signal intensity may be low because the integration time is short, it can be made sufficiently high by providing the photoelectric conversion section (photodiode) with a large area. With this method, it is possible to conduct a high-speed image sensing operation of about 1 million frames per second.

It is possible to use a CCD that is adapted to transferring image signals and employ each transfer stage of the CCD as image signal recording element. If such is the case, the CCD is employed as memory (CCD memory). FIG. 9 of the accompanying drawings illustrates the configuration of image sensor 400. An instance of a device including 2×2 pixels is illustrated in FIG. 9 and each of the pixels is provided with a CCD memory 402 consisted of eight transfer stages in addition to a photoelectric conversion section 401. If the device is so arranged that the signal charges generated by the photoelectric conversion section 401 are sequentially transferred in the direction of the arrow shown in FIG. 9, the CCD memory 402 can temporarily store eight signal charges. When signal charges are stored in all the transfer stages, they are sequentially read out by a vertical CCD 403, starting from the first signal charge. Thereafter, the signal charges are downwardly transferred to a horizontal CCD 404 and then to the left side in the horizontal CCD 404. Subsequently, they are converted into an electric signal and output by an output section 405. In the case of FIG. 9, each pixel has eight image signal recording elements.

In the above-described instance, the CCD memory 402 is made to meander and contained in a single pixel. The CCD memory 402 can be manufactured like the vertical CCD 403 and the horizontal CCD 404. However, when the CCD is made to meander, the electrode structure is required to inevitably be complex at the point where the transfer direction is changed.

NPL 1 describes an improved arrangement where a CCD is not required to meander to secure the number of image signal recording elements. FIG. 10 illustrates the configuration of the image sensor 500. With this arrangement, the signal charges obtained by a photoelectric conversion section 501 are sequentially transferred to a horizontal CCD 503 by way of an input gate 502 and in the rightward direction in the horizontal CCD 503. Vertical CODs 504 are connected to the respective transfer stages of the horizontal CCD 503. When signal charges are stored in all the transfer stages, which are five in total, of the horizontal CCD 503, they are transferred to the respective vertical CCDs 504 all at the same time. As this operation is repeated, the horizontal CCD 503 and the vertical CCDs 504 operate as CCD memory. In the instance of FIG. 10, the number of image signal recording elements each pixel has is 30 in total that are formed by the horizontal CCD 503 having five transfer stages and five vertical CCDs 504, each having five transfer stages. The signal charges are read out as they are transferred to the outside of the illustrated region at the bottom side of the vertical CCDs 504 in FIG. 10.

Since the image signal recording elements are constituted only by the horizontal CCD 503 and the vertical CCDs 504, the arrangement is less complex if compared with the first known arrangement.

NPL 2 describes an image sensor realized by using CCD memories that extend in a direction slightly inclined from the vertical direction and connected to vertical CCDs instead of a horizontal CCD and vertical CCDs of NPL 1. FIG. 11 illustrates the configuration of the image sensor 600. The illustrated image sensor 600 has 3×3 pixels. A CCD memory 602 slightly inclined from the vertical direction is connected to a photoelectric conversion section 601. The CCD memory 602 linearly extends in that direction and is connected to a vertical CCD 603 at a position located below the pixel to which the photoelectric conversion section 601 belongs. The signal charges obtained by the photoelectric conversion section 601 are transferred downwardly in the CCD memory 602 and converted into an electric signal and read out by way of the vertical CCD 603 and a horizontal CCD 604. The vertical CCDs. 603 and the horizontal CCD 604 operate like their counterparts in FIG. 9.

Since the CCD memories 602 can be made linearly long with this arrangement, it is possible to provide a larger number of image signal recording elements (a large number of transfer stages). Additionally, this arrangement is structurally simple and can be manufactured with ease because only linear CCDs are employed. This image sensor 600 can successively and continuously pick up 144 images at a speed of one million frames per second with 300 thousands pixels.

An image sensor for high-speed image sensing operations can be obtained by using an IS (in-situ storage) type sensor having the above-described structure.

CITATION LIST

Patent Literature

[NPL 1] F. W. Kosonocky et al., "360×360—Element Very High Frame Rate Burst Image Sensor", ISSCC1996, Digest of Technical Papers, P 182 (1996)
[NPL 2] G. Etoh et al., "A CCD Image Sensor of 1M frames/s for Continuous Image Capturing of 103 Frames", ISSCC 2002, Digest of Technical Papers, P 45 (2002)

SUMMARY OF INVENTION

Technical Problem

There may be experiments using an accelerator for observing the phenomenon that takes place as a result of collisions of particles such as neutrons. Then, it will be required not to observe particles themselves but to speedily pickup images of emissions of light that occurs when particles strike a fluorescent substance (scintillator) and lasts only for a short time. Then, the light signal that is received is weak so that, if a high-speed image pickup operation is conducted to reduce the integration time, no satisfactory image signal can be obtained with a high intensity or with a sufficiently high S/N ratio to make it difficult to obtain good images.

Thus, it has been difficult to obtain image signals with a high S/N ratio in a high-speed image pickup operation.

In view of the above-identified problem, it is therefore the object of the present invention to provide means for solving the problem.

Solution to Problem

According to the present invention, the above problem is dissolved by the following arrangements.

In an aspect of the present invention, there is provided an image sensor including two-dimensionally arranged pixels for image sensing operations and outputting an image signal, each of the pixels having:

a photoelectric conversion section that outputs light as signal charges; a plurality of image signal recording elements that accumulate a plurality of signal charges output from the photoelectric conversion section at a plurality of different image pickup timings in a series of image pickup operations; the plurality of image signal recording elements being adapted to respectively accumulate a plurality of integrated signal charges obtained by adding a plurality of signal charges output from the photoelectric conversion section at a plurality of different image pickup timings in another series of image pickup operations respectively to the plurality of signal charges accumulated in the image signal recording elements; and output an image signal according to the plurality of integrated signal charges.

Preferably, in the image sensor according to the present invention, the plurality of image signal recording elements are a CCD memory including a plurality of transfer stages; and
the CCD memory has:
an input transfer stage into which a signal charge is injected and a final transfer stage that is the final stage in the transfer direction of the CCD memory arranged side by side so as to make it possible for a transfer operation to take place from the final transfer stage to the input transfer stage.

Preferably, in the image sensor according to the present invention, the CCD memory has:
a plurality of lines formed by a plurality of linearly arranged transfer stages in such a way that the transfer directions of adjacent lines are opposite relative to each other.

Preferably, in the image sensor according to the present invention, the channel of each transfer stage of the CCD memory includes:
a first doped region that shows an impurity concentration selected so as to form a potential well in the channel when a predetermined voltage is applied to transfer electrodes formed on the channel by way of an oxide film and a second doped region that forms a potential well deeper than the first doped region when the voltage is applied; the direction directed from the first doped region to the second doped region at a transfer stage on one of two adjacent lines and the direction directed from the first doped region to the second doped region on the other line being opposite relative to each other; the transfer stage at the tail end in the transfer direction of the upstream side line located at the upstream side of the transfer direction of one of the two adjacent lines and the transfer stage at the starting point in the transfer direction of the downstream side line located at the downstream side of the transfer direction of the other line being connected at a transfer stage having the first doped region at the side of the upstream side line and the second doped region at the side of the downstream side line.

Preferably, in the image sensor according to the present invention, the CCD memory is a 4-phase CCD or a 3-phase CCD; and two wires are used, one for mutually connecting the transfer electrodes located respectively at the upstream sides in the transfer directions of two adjacent lines and the other for mutually connecting the transfer electrodes located respectively at the downstream sides in the transfer directions of the two adjacent lines out of the continuously arranged two transfer electrodes to be used on one of the adjacent two lines and the continuously arranged two transfer electrodes to be used on the other line; the two wires crossing each other between the two lines.

Preferably, in the image sensor according to the present invention, the CCD memory include three or more lines, of which any two adjacent lines show opposite transfer directions; and the transfer electrodes on each of the three or more lines are made to be electrically common by forming the two wires between adjacent ones of the three or more lines.

Preferably, in the image sensor according to the present invention, the CCD memory has two different operation modes for transfer operations including: an overwrite mode for an operation of not transferring any signal charge from the final transfer stage to the input transfer stage; and an accumulation mode for an operation of transferring from the final transfer stage to the input transfer stage and subsequently injecting the signal charge output from the photoelectric conversion section into the input transfer stage.

Preferably, in the image sensor according to the present invention, a gate for discharging the signal charges exceeding a predetermined quantity to the outside of the CCD memory is connected to a transfer stage in the CCD memory.

In another aspect of the present invention, there is provided an image pickup apparatus for acquiring image Signals by means of an image sensor as defined above.

In still another aspect of the present invention, there is provided a semiconductor device using a CCD including a plurality of parallel lines formed by a plurality of linearly arranged transfer stages in such a way that the transfer directions of adjacent lines are opposite relative to each other, wherein the channel of the CCD memory includes:

a first doped region that shows an impurity concentration selected so as to form a potential well in the channel when a predetermined voltage is applied to transfer electrodes formed on the channel by way of an oxide film and a second doped region that forms a potential well deeper than the first doped region when the voltage is applied; the direction directed from the first doped region to the second doped region at a transfer stage on one of two adjacent lines and the direction directed from the first doped region to the second doped region on the other line being opposite relative to each other; the transfer stage at the tail end in the transfer direction of the upstream side line located at the upstream side of the transfer direction of one of the two adjacent lines and the transfer stage at the starting point in the transfer direction of the downstream side line located at the downstream side of the transfer direction of the other line being connected at a transfer stage having the first doped region at the side of the upstream side line and the second doped region at the side of the downstream side line.

In still another aspect of the present invention, there is provided a semiconductor device using a CCD including a plurality of parallel lines formed by a plurality of linearly arranged transfer stages in such a way that the transfer directions of adjacent lines are opposite relative to each other, the CCD being a 4-phase CCD or a 3-phase CCD; wherein, two wires are used, one for mutually connecting the transfer electrodes located respectively at the upstream sides in the transfer directions of two adjacent lines and the other for mutually connecting the transfer electrodes located respectively at the downstream sides in the transfer directions of the two adjacent lines out of the continuously arranged two transfer electrodes to be used on one of the adjacent two lines and the continuously arranged two transfer electrodes to be used on the other line; the two wires crossing each other between the two lines.

In still another aspect of the present invention, there is provided an image sensing method of using an image sensor having two-dimensionally arranged pixels for converting light into signal charges, each pixel being provided with a plurality of image signal recording elements for storing the signal charges obtained by a single image pickup operation, and adapted to store a plurality of signal charges obtained at a plurality of image pickup timings for each pixel, and output image signals according to the plurality of signal charges, the method including:

an overwrite step of conducting image pickup operations for a number of times equal to the number of the image signal recording elements of each pixel from a state where the plurality of image signal recording elements are reset and injecting the signal charges obtained by each image pickup operation into the image signal recording elements for accumulation; an accumulation step of conducting image pickup operations once again for a number of times equal to the number of the image signal recording elements of each pixel after the overwrite step and newly accumulating the integrated signal charges obtained by injecting the signal charges obtained by each image pickup operation into the image signal recording elements and adding them to the signal charges already accumulated in the image signal recording elements; and a read step of reading out the accumulated integrated signal charges from the image signal recording elements and outputting image signals according to the integrated signal charges.

Preferably, in the image sensing method, the accumulation step is executed for a plurality of times between the overwrite step and the read step and a plurality of image pickup operations are conducted in the plurality of accumulation steps periodically by referring to the image pickup timings of the plurality of image pickup operations in the overwrite step.

Advantageous Effects of Invention

According to the present invention as defined above, it is possible to obtain image signals with a high S/N ratio in a high-speed image sensing operation.

DESCRIPTION OF EMBODIMENTS

Now, a preferred embodiment of image sensor according to the present invention will be described below. The image sensor is designed so as to be used to acquire a two-dimensional image and includes M (horizontal)×N (vertical) pixels (M, N>1) that are two-dimensionally arranged. A photoelectric conversion section and K image signal recording elements (K>1) are arranged in each of the pixels. The K image signal recording elements are those of a CCD having K transfer stages. The image signals obtained by each photoelectric conversion section are temporarily stored in the image signal recording elements and subsequently read out by a vertical CCD and transferred further to a horizontal CCD, there they are output to the outside.

Figure 1:
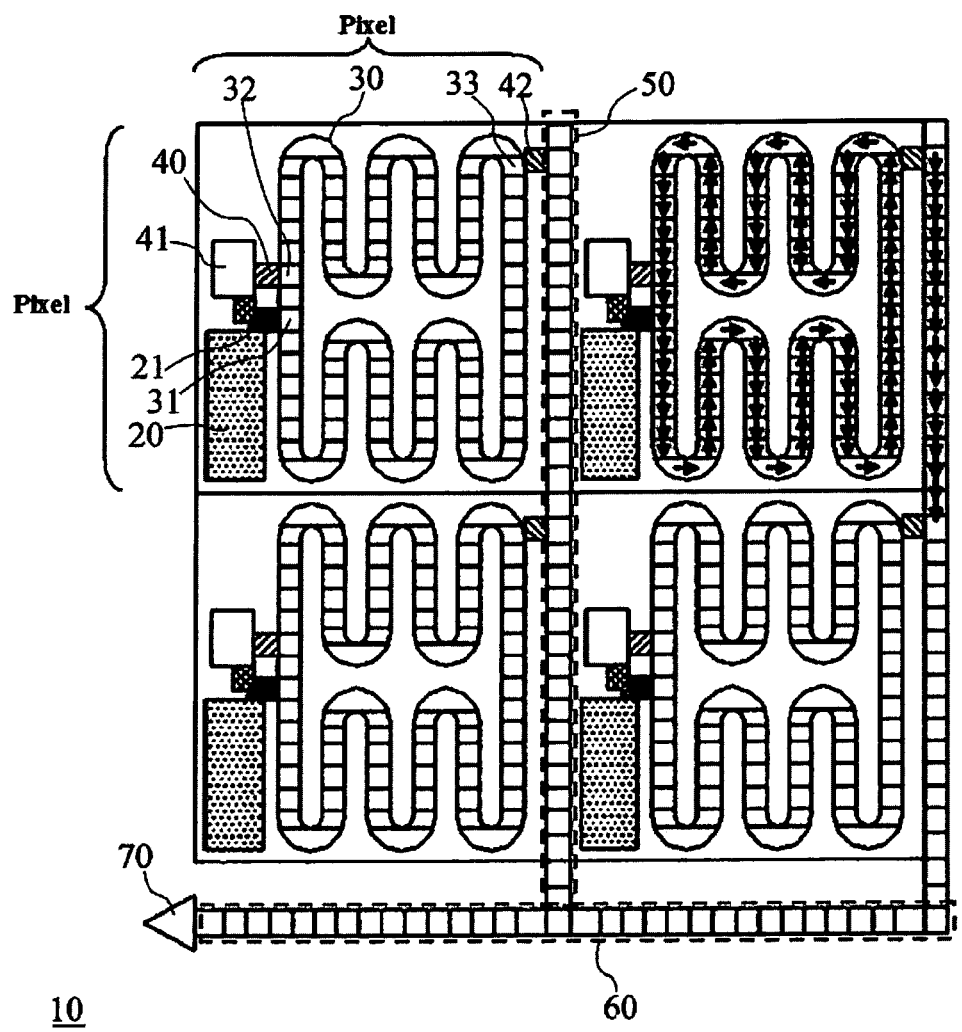
FIG. 1 is a schematic illustration of the configuration of an embodiment of image sensor according to the present invention.

FIG. 1 is a schematic illustration of the configuration of the image sensor 10. M=N=2 is employed here for the purpose of simplification. The number of image signal recording elements (CCD memory) of a pixel is equal to the number of transfer stages. K=38 is employed here (1 transfer stage is formed by 2 partitions in FIG. 1). Thus, the image sensor 10 can store image signals for 38 frames in the image signal recording elements.

The photoelectric conversion section 20 is a photodiode using a pn junction. The light received by the photoelectric conversion section 20 is converted into a signal charge. As the signal charge is applied to an input gate 21 (turning on the input gate 21), it is input to an input transfer stage 31 that is the transfer stage operating as starting point in the transfer direction of CCD memory 30. This operation is an operation conforming to the general principle of CCDs.

The CCD memory 30 is an ordinary CCD (charge coupled device) and formed to have a meandering profile as shown in FIG. 1. A signal charge is transferred from the input transfer stage 31 to the final transfer stage 32. The final transfer stage 32 is so formed as to be connected to the input transfer stage 31 so that a signal charge can be transferred from the final transfer stage 32 to the input transfer stage 31. In other words, the CCD memory 30 has a circulative arrangement. The final transfer stage 32 is connected to a drain gate 40 and the signal charge transferred to the final transfer stage 32 is transferred to a drain 41 as a voltage is applied to the drain gate 40. The drain 41 is a diffusion region for which a predetermined electric potential is defined. As a signal charge is input to the drain 41, it is discharged to the outside as electric current by way of the electrode connected to the drain 41. Therefore, the final transfer stage 32 is reset when a voltage is applied to the drain gate 40. Thus, if the next transfer operation is conducted in the CCD memory in this state, the input transfer stage 31 falls into a reset state. With this arrangement, the signal charge transferred to the final transfer stage 32 is then transferred either to the drain 41 or to the input transfer stage 31 that is selected. While the specific configuration of the CCD memory 30 will be described in greater detail hereinafter, the CCD memory 30 is employed to accumulate (store) signal charges to the respective transfer stages.

An output transfer stage 33 is arranged somewhere on the transfer route from the input transfer stage 31 to the final transfer stage 32 (upper right in FIG. 1). The output transfer stage 33 is one of the transfer stages of an ordinary CCD and a readout gate 42 is connected to the output transfer stage 33 so that, when a predetermined voltage is applied to the readout gate 42 (to turn on the readout gate 42), the signal charge in the output transfer stage 33 is transferred to a vertical CCD 50. Therefore, with this arrangement, the signal charge transferred to the output transfer stage 33 is transferred either to the next transfer stage (and hence accumulated in the CCD memory 30) or to the vertical CCD 50.

The vertical CCD 50 is similar to the vertical CCD of an ordinary interline CCD and adapted to transfer signal charges downwardly in FIG. 1 from the starting point to the ending point at the bottom section. Since a vertical CCD 50 is arranged for each column of pixels in FIG. 1, a total of two vertical CCDs are provided to agree with the value of M in FIG. 1. The signal charges from the pixels arranged at vertically different positions in FIG. 1 are transferred to different transfer stages of the vertical CCD 50.

A horizontal CCD 60 is connected to the ending point of each of the vertical CODs 50 and the transferred signal charges are then transferred to the horizontal CCD 60. The horizontal CCD 60 is similar to the horizontal CCD of an ordinary interline CCD and adapted to transfer signal charges leftward in FIG. 1. The signal charges transferred to the ending point of the horizontal CCD 60 are injected at output section 61 into the floating diffusion (not shown) having a reverse-biased pn junction and the electric potential is amplified by an amp (not shown) and output to the outside of the image sensor 10.

Although not illustrated, it is preferably so arranged that no electric charges get into the region outside the photoelectric conversion sections 20 in FIG. 1 including in particular the CCD memories 30, the vertical CCDs 50 and the horizontal CCD 60 except the signal charges obtained at the photoelectric conversion section 20. For this reason, the CCD memories 30, the vertical CCDs 50 and the horizontal CCD 60 are provided thereon with a metal-made light shielding film so that no light may enter them to generate electric charges.

The operations of transferring signal charges from the pixels to the vertical CCDs 50 can be conducted simultaneously and the signal charges injected into the vertical CCDs 50 from the pixels are sequentially transferred to the horizontal CCD 60 and then horizontally leftward in the horizontal CCD 60 for output. This operation is similar to that of an ordinary interline CCD. In short, the image sensor 10 operates like an ordinary interline CCD from the operation step of reading out signal charges from the pixels.

The operations that take place in each of the CCD memories 30 of the image sensor 10 will be described below. Firstly, the signal charge obtained at a predetermined image pickup timing and in an integration time by the photoelectric conversion section 20 is transferred to the input transfer stage 31 in the CCD memory 30 by way of the input gate 21. After transferring the signal charge by a stage in the CCD memory 30, the signal charge obtained at the next image pickup timing in an integration time by the photoelectric conversion section 20 is newly transferred to the input transfer stage 31. The signal charges as many as the number of the image signal recording elements that are obtained by so many image pickup operations at so many different image pickup timings can be sequentially transferred to and accumulated in the respective elements (transfer stages) of the CCD memory 30 by repeating the above operation. Since the number of elements in the CCD memory 30 is 38 in the instance of FIG. 1, the signal charges obtained by the photoelectric conversion section 20 by 38 image pickup operations can be accumulated in the CCD memory 30. Each pixel is provided with a CCD memory 30 and the signal charges accumulated in each CCD memory 30 are obtained by a same photoelectric conversion section 20 at different image pickup timings. This operation is similar to those of the image sensors described in NPL 1 and NPL 2. With this arrangement, the signal charges obtained at short image pickup timing intervals and with a short integration time can be temporarily stored in a CCD memory 30 and subsequently read out and output.

Each of the pixels of this image sensor 10 subsequently operate either in an overwrite mode or in an accumulation mode.

In the overwrite mode, the 38 transfer stages in the CCD memory 30 store signal charges obtained at 38 image pickup timings in a manner as described above. Thus, the first signal charge is in the final transfer stage 32. If neither the drain gate 40 nor the input gate 21 are turned on and a single transfer operation is conducted at the CCD memory 30, the first signal charge is straightly transferred to the input transfer stage 31 once again and can be sequentially transferred again to the output transfer stage 33. As the first signal charge is transferred to the output transfer stage 33, then the signal charge at the output transfer stage 33 is injected into the vertical CCD 50 by applying a predetermined voltage to the readout gate 42 (turning on the readout gate 42). As transfer operations are sequentially conducted at the CCD memory 30 and the vertical CCD 50, while keeping on applying the voltage to the readout gate 42, the next signal charge is also sequentially transferred to the vertical CCD 50 in the same way. Thus, the image signals recorded in the CCD memory 30 can be sequentially read out at the vertical CCD 50. Then, as a result, the signal charges that are read out are extinguished from the inside of the CCD memory 30 and hence the transfer stages are reset. Subsequently, this reset state gets to the input transfer stage 31 by way of the final transfer stage 32 once again. Then, a overwrite operation of newly injecting a signal charge into the input transfer stage 31 is conducted in this state. The end result is that an overwrite operation of storing new signal charges in all the transfer stages of the CCD memory 30 is completed.

When the image signals recorded in the CCD memory 30 are not to be read out at the vertical CCD 50, the recorded image signals (signal charges) are discharged from the drain 41 by turning on the drain gate 40 at the time of conducting transfer operations in the CCD memory 30. As a result of this operation, the signal charge in the input transfer stage 31 is reset. Therefore, in this case again, an overwrite operation is conducted in a manner as described above.

When conducting an overwrite operation and a signal charge is injected from the photoelectric conversion section 20 into the input transfer stage 31 in the CCD memory 30, the input transfer stage 31 is in a reset state. Therefore, the most fresh image signals (signal charges) of 38 frames are stored in the CCD memory 30. Thereafter, the most fresh image signals of 38 frames are read out by way of the vertical CCD 50 and the horizontal CCD 60. While a considerable time may be required to read the image signals of 38 frames, the read time is unrelated to the time intervals of the frames because the read operation is conducted after temporarily storing the image signals of 38 frames in the CCD memory 30. Thus, the time intervals of frames can be reduced to make it possible to realize a high-speed image pickup operation. This operation is same as that of any conventional IS-type CCD image sensor.

Now, operations in the accumulation mode will be described below. The accumulation mode is particularly preferably employed when picking up an image of a repetitive phenomenon.

Operations in the accumulation mode are same as those in the overwrite mode until image signals of 38 frames are stored in the CCD memory 30. Note that, however, in the accumulation mode, the next transfer operation is conducted at the CCD memory 30 without turning on the readout gate 42 and the drain gate 40. Then, as a result, the accumulated signal charges are sequentially transferred on a stage by stage basis and the signal charge that is obtained at the first image pickup timing is straightly transferred once again to the input transfer stage 31. The signal charge that is newly obtained in this state at the photoelectric conversion section 20 at the next image pickup timing is injected into the input transfer stage 31 byway of the input gate 21. Thus, as a result of this operation, the signal charge that is obtained at the most recent image pickup timing is added to the signal charge already stored in the input transfer stage 31 so that an integrated signal charge produced by integration of the two signal charges is accumulated in the input transfer stage 31. As this operation is repeated to carry out transfer operations for 38 elements (1 cycle), each of all the transfer stages of the CCD memory 30 accumulates an integrated signal charge produced by integration of two image signals. More image signals can be integrated as such integrating operations are repeated for another cycle at the CCD memory 30. In short, by repeating integrating operations for a desired number of cycles, integrated signal charges obtained by integrating image signals for a number of times that is equal to the number of cycles can be accumulated and stored.

The subsequent operations of reading image signals from the CCD memory 30 are same as those in the overwrite mode that are described above. In other words, integrated signal charges can be sequentially read out from the output transfer stages 33 by way of the readout gate 42, the vertical CCD 50 and the horizontal CCD 60 by conducting transfer operations at the CCD memory 30.

Note, however, that the image signals obtained in the accumulation mode are image signals of integrated signal charges obtained by integrations conducted for a desired number of cycles. Therefore, if a phenomenon is such that only weak image signals can be obtained by a single image pickup operation, it is possible to obtain an image with a high S/N ratio by way of integrating operations. Therefore, if the phenomenon to be observed (and an image thereof is to be picked up) by the image sensor 10 takes place cyclically with a fixed time period, an image of the phenomenon can be picked up with a high S/N ratio by making the cycle period of operation in the accumulation mode agree with the cycle period of the phenomenon.

The operations of the first cycle in the accumulation mode are same as those in the overwrite mode. More specifically, with the image sensing method that the image sensor executes in the accumulation mode, firstly an image pickup operation of the first cycle is conducted in a state where the CCD memory 30 (a plurality of image recording elements) are reset and the obtained signal charges are stored in the CCD memory 30 (overwrite step). The signal charges are injected into the respective transfer stages (image recording elements) and accumulated there. Then, an image pickup operation of the second cycle is conducted and the obtained signal charges are injected into the transfer stages and the integrated signal charges obtained by adding them to the respective signal charges that are already accumulated are newly accumulated in the respective transfer stages of the CCD memory 30 (accumulation step). The operation of the accumulation step can be repeated for a desired number of times. Then, the integrated signal charges obtained by adding newly obtained signal charges to the respective signal charges (integrated signal charges) that are already accumulated in each transfer stage for each accumulation step are newly accumulated as the most recent integrated signal charges. Thereafter, the accumulated integrated signal charges are sequentially read out from the CCD memory 30 and image signals are output according to them (read step).

At this time, the above-described cycle period becomes fixed by making the image pickup timings of a plurality of image pickup operations in a plurality of accumulation steps periodical, referring to the image pickup timings of a plurality of image pickup operations in the overwrite step. Then, an image of a phenomenon that appears repeatedly with such a cycle period can be picked up with a high S/N ratio.

Only two types operation are described for the drain gate 40 in the above instance for the purpose of simplicity. They are an operation of turning on the drain gate 40 and an operation of turning off the drain gate 40. The expression of turning "on" as used herein means that a voltage that can transfer all the signal charges in the final transfer stage 32 to the drain gate 40 is applied and that of turning "off" means that a voltage that does not transfer any of the signal charges is applied (or no voltage is applied). However, a voltage of a level somewhere between them may be applied to the drain gate 40 so as to transfer only the signal charges exceeding a predetermined quantity to the drain gate 40. This is a function similar to that of a blooming suppression gate for suppressing a phenomenon referred to as blooming (a phenomenon where the signal charges to be transferred exceed the quantity of electric charge that can be transferred and get into and become mixed with the signal charges of adjacent elements). In short, it is possible to make the drain gate 40 function so as to suppress blooming for the image signals to be read out. This operation can be realized both in the overwrite mode and in the accumulation mode. Note that the drain gate 40 may not necessarily be arranged at the final transfer stage 32 and may alternatively be arranged at any other transfer stage of the CCD memory 30.

With the above-described arrangement, it is possible to appropriately and optionally use the overwrite mode and the accumulation mode to realize a high-speed image sensing operation by means of the image sensor 10.

The above-described image sensor 10 is characterized most remarkably by the existence of CCD memories 30 having a meandering profile that are arranged for respective pixels. In order to secure the necessary number of image signal recording elements (transfer stages) for each of the CCD memories 30, it is effective to provide a plurality of lines running in parallel with each other, at each of which a plurality of transfer stages are linearly arranged, in such a way that adjacent lines show mutually opposite transfer directions. With this arrangement, the CCD memory 30 can temporarily store a large number of pieces of information on image signals, which is advantageous particularly for high-speed image sensing operations.

Figure 2A:
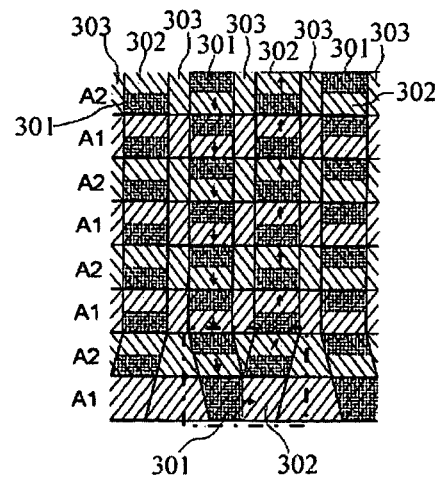
FIGS. 2A and 2B are a schematic illustration of an exemplar configuration of the CCD memory, which is a 2-phase CCD, of an embodiment of image sensor according to the present invention.
Figure 2B:
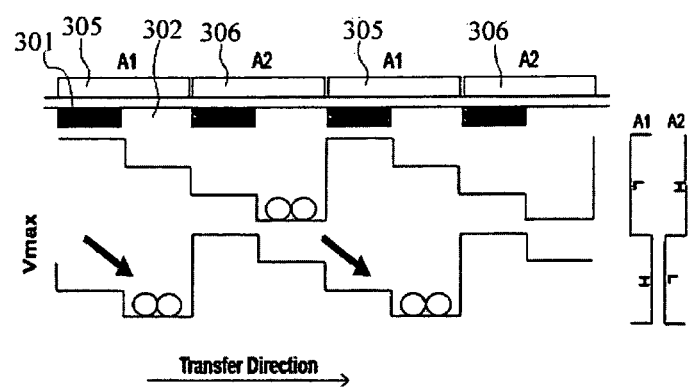

Now, CCD memories 30 having the above-described configuration will be described more specifically below. Firstly, an instance where a CCD memory 30 is operated for 2-phase will be described. FIGS. 2A and 2B illustrate the arrangement of a part of the CCD memory 30 where the transfer direction changes when it is operated for 2-phase. FIG. 2A is a plan view of that part and FIG. 2B is a schematic illustration of the cross section of the related channel and its vicinity and the situation thereof when signal charges are transferred along with the shape of the applied pulse. Referring to FIG. 2A, the center left line has a downward transfer direction and the center right line has an upward transfer direction and the two lines are connected by the bottom end transfer stage. Therefore, signal charges are transferred from the center left line to the center right line.

Referring to the plan view (FIG. 2A), the channel region of each element (transfer stage) in the CCD memory 30 includes regions of two types whose impurity concentrations are different from each other. They are the first doped regions 301 and the second doped regions 302. Transfer electrodes are formed on the two regions by way of an oxide film (not shown). No depletion layer is formed except the channel region and channel stop regions 303 showing a raised impurity concentration and/or provided with a thick oxide film are formed so as not to store any signal charge.

In the case of 2-phase drive, A1 electrodes 305 and A2 electrodes 306 are employed as two types of transfer electrodes, to which a same pulse is applied. As shown at the top of FIG. 2B, A1 electrodes 305 and A2 electrodes 306 are arranged alternately at each transfer stage. With this arrangement, the transfer electrodes of adjacent transfer stages are arranged independently and same transfer electrodes (transfer electrodes for showing a same electric potential) exist both on the first doped region 301 and on the second doped region 302.

The impurity concentration of the first doped regions 301 is selected in such a way that potential wells are formed in the channel when a predetermined voltage is applied to the transfer electrodes of the first doped regions 301 according to the operation principle of CCDs. The impurity concentration of the second doped regions 302 is selected in such a way that, when the same voltage is applied to the transfer electrodes of the second doped regions 302, the potential wells formed in the second doped regions 302 become deeper than the potential wells formed in the first doped regions 301 as shown in FIG. 2B. Additionally, in each transfer stage, a first doped region 301 is located in front of a second doped region 302 as viewed in the direction of transferring signal charges. With this arrangement, when a pulse voltage that makes the potential of the A1 electrodes 305 and that of the A2 electrodes 306 alternately become High and Low as shown in the right part of FIG. 2B is applied, the energy diagram of the potential wells in the corresponding channel region will be the one shown in FIG. 2B. Signal charges (shown by circles in FIG. 2B) are stored in the minimal points of the potential wells and are transferred highly efficiently from the left side to the right side as the minimal points are shifted sequentially. This arrangement is same as that of any known 2-phase CCDs.

Note, however, that the signal charges that are transferred from above to below on the center left line are then forced to turn at the center bottom and then transferred from below to above on the adjacent right line as shown in FIG. 2A. As described above, a first impurity region 301 is formed on a second doped region 302 at each transfer stage on the center left line. Conversely, a first doped region 301 is formed under a second doped region 302 at each transfer stage on the center right line. At the transfer stage at the bottom that provides an inflection point, a first doped region 301 is at the left side and a second doped region 302 is formed at the right side. Thus, the direction from the first doped region 301 to the second doped region 302 at each transfer stage on one of two adjacent lines is reverse relative to the direction from the first doped region 301 to the second doped region 302 at each transfer stage on the other line. Additionally, the transfer stage at the trailing end of the upstream side line (center left line) located at the upstream side as viewed in the transfer direction and the transfer stage at the leading end of the downstream side line (center right line) located at the downstream side as viewed in the transfer direction are connected to each other by way of a transfer stage having the first doped region 301 at the side of the upstream side line and the second doped region 302 at the side of the downstream side line.

With this arrangement, signal charges can be transferred from the center left line to the center right line by using the A1 electrodes 305 and the A2 electrodes 306 as transfer electrodes. Such an arrangement can be produced with ease by selectively injecting ions into a region that corresponds to the first doped regions 301 or the second doped regions 302. The oxide film and the transfer electrodes arranged thereon can be formed as in the case of any known CCD. Thus, a CCD memory having the above-described structure can be manufactured with ease as in the case of manufacturing an ordinary 2-phase drive CCD. The arrangement of impurity distribution as described above can be applied to CODs other than 2-phase CCDs.

While only the arrangement of two lines are described above, it will be clear that a similar arrangement can be applied to any two adjacent lines if there are three or more lines and a complete CCD memory can be produced by connecting all the two adjacent lines.

Figure 3A:
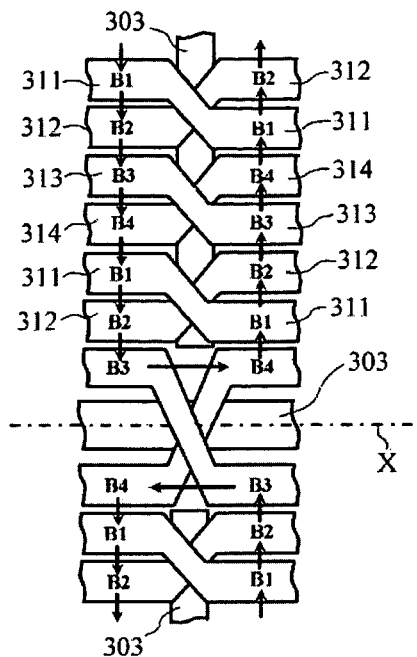
FIGS. 3A and 3B are a schematic illustration of an exemplar configuration of the CCD memory, which is a 4-phase CCD, of an embodiment of image sensor according to the present invention.

Now, an instance where a CCD memory 30 is operated for 4-phase will be described. While a 2-phase CCD is characterized by the doping distribution of each transfer stage, a 4-phase CCD is characterized by the configuration of transfer electrode. FIG. 3A is a schematic plan view of the arrangement and FIG. 3B is a schematic illustration of the cross section of the related channel and its vicinity and the situation thereof when signal charges are transferred along with the shape of the applied pulse.

With this arrangement, four types of transfer electrodes including B1 electrodes 311, B2 electrodes 312, B3 electrodes 313 and B4 electrodes 314 are employed. Transfer of signal charges takes place sequentially in the direction from a B1 electrode 311 to a B4 electrode 314. Unlike 2-phase drive, it is not necessary to provide an doping distribution at the channel parts under the electrodes.

Figure 3B:
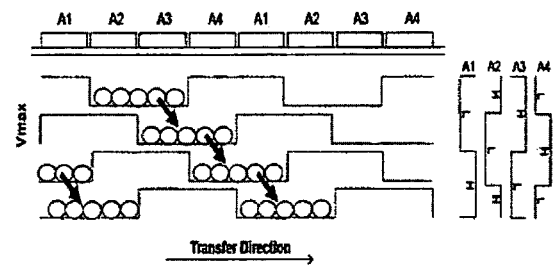

With this arrangement, when a pulse as shown in the right part of FIG. 3B is applied, the energy diagram of the potential wells in the corresponding channel region will be the one shown in FIG. 3B. Signal charges are accumulated in the minimal points of the potential wells and are transferred from the left side to the right side as the minimal points are shifted sequentially. This arrangement is same as that of any known 4-phase CCDs. With this arrangement, the channel immediately below adjacent (successive) two transfer electrodes, for example, B1 electrode 311 and B2 electrode 312, can be regarded as a single image signal recording element as may be clear from FIG. 3B.

What is characteristic here is that the transfer electrodes of two adjacent lines are connected by using an arrangement as shown in FIG. 3A. With this arrangement, a B1 electrode 311, a B2 electrode 312, a B3 electrode 313 and a B4 electrode 314 are arranged in the above mentioned order as viewed in the transfer direction. Since the transfer direction is directed downward at the left line and upward at the right line, the four electrodes are arranged reversely relative to each other of the two lines. If a B1 electrode 311 and a B2 electrode 312 form a pair and a B3 electrode 313 and a B4 electrode 314 form another pair, each pair of one of the lines is turned upside down from the corresponding pair of the other line.

The dotted chain line X in FIG. 3A is the boundary line of two pixels. In other words, the CCD memory arranged under the dotted chain line X stores and transfers image signals of a pixel different from the pixel of the upper CCD memory. A channel stop region 303 is formed at the boundary region of a left line and a right line and also at the boundary region of an upper pixel and a lower pixel.

With this arrangement, a B1 electrode 311 and a B2 electrode 312 are located side by side and a B3 electrode 313 and a B4 electrode 314 are located side by side on the left and right lines. Then, two B1 electrodes 311, two B2 electrodes 312, two B3 electrodes 313 and two B4 electrodes 314 on the two adjacent lines can be mutually connected without problem by using two wires that cross each other on the boundary of the two lines to form a so-called double twisted-pair electrode structure as shown in FIG. 3B. In other words, in this structure, of any two successive transfer electrodes arranged on one of the lines and the two successive transfer electrodes arranged at the side of the former two electrodes on the other line, the upstream side transfer electrodes of the two lines (B1 electrodes 311 or B3 electrodes 313) and the downstream side transfer electrodes of the two lines (B2 electrodes 312 or B4 electrodes 314) are connected respectively by two wires and the two wires cross each other between the two lines (on channel stop region 303).

Figure 4:
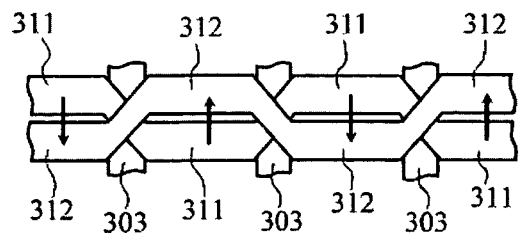
FIG. 4 is a schematic illustration of an exemplar double twisted-pair electrode structure of 4 lines.

As a result, when a transfer pulse is applied to each of the electrodes on one of the lines, the transfer pulse is also applied to the electrodes on the other line. As shown in FIG. 3A, the electrodes of two different pixels that are arranged adjacently can be mutually connected so as to cross the boundary line X (channel stop region 303) separating them. Furthermore, while FIG. 3A shows only two adjacent lines, the above description applies to an arrangement where there are three or more lines so long as any two adjacent lines thereof show opposite transfer directions. In other words, by using such a double twisted-pair electrode structure, an arrangement of applying 4 types of transfer pulses can be realized with ease for a structure where any two adjacent lines show opposite transfer directions. FIG. 4 schematically illustrates an exemplar double twisted-pair electrode structure of 4 lines. Such a structure is particularly suitable for a CCD memory 30 formed by combining lines showing opposite transfer directions as described above. Additionally, since pixels can be connected to each other so as for the wires connecting them to cross the boundary line X, the area occupied by a CCD memory in the total area of a pixel can be reduced. Then, the area of each pixel can be reduced to downsize the chip having such pixels. Alternatively, the area occupied by the photoelectric conversion section of a pixel can be raised to improve the S/N ratio of image signals if the area of the pixel is not reduced. As shown in FIG. 3A, in a region where pixels are formed successively (the boundary region X and the upper and lower regions thereof in FIG. 3A), the electrodes of transversally adjacent pixels show a folded structure. Additionally, the electrodes arranged at end sections of such regions (positions neighboring the boundary region X) are commonly used. This arrangement is particularly effective when a plurality of linearly formed CODs is arranged in parallel to secure the total number of transfer stages.

Figure 5:
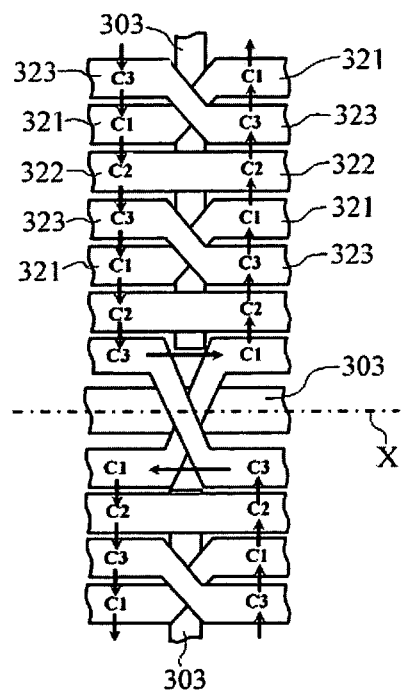
FIG. 5 is a schematic illustration of an exemplar double twisted-pair electrode structure used for a 3-phase CCD.

Note that a double twisted-pair electrode structure can be used for other than 4-phase CCDs. FIG. 5 is a schematic illustration of an exemplar double twisted-pair electrode structure used for a 3-phase drive CCD, which is a plan view as seen from above. Three types of electrodes including C1 electrodes 321, C2 electrodes 322 and C3 electrodes 323 are employed for this structure and a signal charge is transferred when a transfer pulse is applied to any of them. With this arrangement, a C1 electrode 321 and a C3 electrode 323 are located side by side and two C2 electrodes 322 are located side by side. Then, the C2 electrodes 322 are connected to form an ordinary electrode structure that extends horizontally, whereas the C1 electrode 321 and the C3 electrode C323 are connected to form a double twisted-pair electrode structure. When a C3 electrode 323 and a C1 electrode 321 are located near the boundary line X of pixels, the electrodes of the upper pixel and those of the lower pixel can be connected by means of a double twisted-pair electrode structure. The above-described arrangement can be applied to three or more lines that are located side by side.

Thus, an image sensor 10 having a configuration as described above can be manufactured like any conventional image sensor (CCD image sensor). The area occupied by CCD memories 30 can be minimized by using the above-described arrangement for the CCD memories 30 to suppress any possible increase of the pixel area or the chip area. Then, such an image sensor can be manufactured at low cost if compared with conventional high-speed image sensors.

When an interlaced image sensing method (of alternately recording pixels of odd-numbered columns and even-numbered columns and reading image signals in them) is employed, each CCD memory 30 can continuously record frames substantially twice as many as the number of transfer stages K of the CCD memory 30 (for example, 300 frames when K=150). Furthermore, with an arrangement of sequentially recording image signals in four pixels that are horizontally and vertically adjacently arranged and reading image signals from them, each CCD memory 30 can continuously record frames four times as many as the number of transfer stages.

It will be clear that the arrangements of FIGS. 2A through 5 can be applied to any semiconductor devices other than image sensors that include CCDs where a plurality of lines having a plurality of linearly arranged transfer stages are formed in parallel and any two adjacent lines show opposite transfer directions. Examples of using CCD memories for other than image sensing applications include delay lines.

While signal charges or integrated signal charges are read out from each pixel by means of a vertical CCD and a horizontal CCD in the arrangement of FIG. 1, they can alternatively be read out by means of a CMOS switch. In other words, signal charges or integrated signal charges can be read out from each pixel for high-speed image pickup operations and the S/N ratio of image can be improved regardless of the method employed for reading them.

Figure 6:
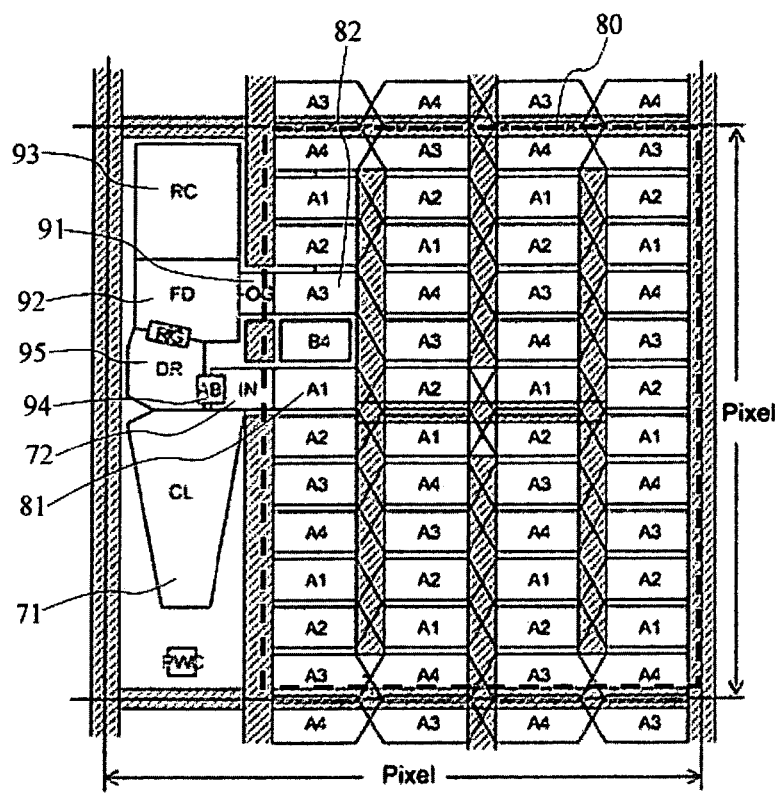
FIG. 6 is a schematic illustration of an exemplar arrangement having a read circuit in a single pixel to which the present invention is applied.
Figure 7A:
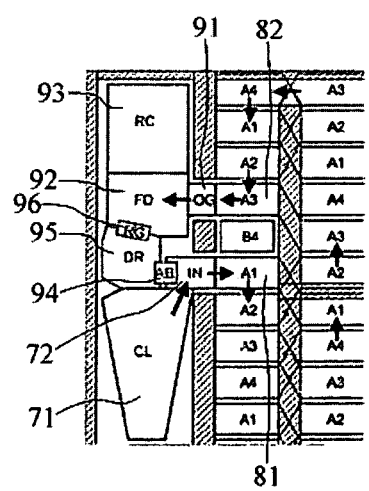
FIGS. 7A through 7C are a schematic illustration of operations in an overwrite mode (A), in an accumulation mode (B) and at a read time (C) of a structure having a read circuit in a single pixel to which the present invention is applied.
Figure 7B:
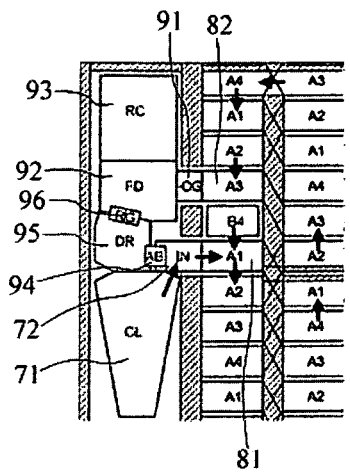
Figure 7C:
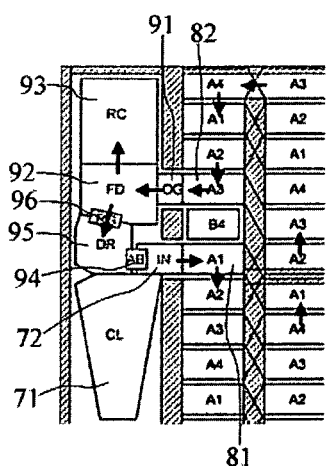

The use of CCD memories having the above-described configuration is effective for pixel structures different from the one illustrated in FIG. 1. This will be described below. FIG. 6 is a schematic illustration of an exemplar arrangement having not only a photoelectric conversion section and a CCD memory but also a signal read circuit in a single pixel. FIGS. 7A through 7C are a schematic illustration of operations (flows of signal charges) in an overwrite mode (A), in an accumulation mode (B) and at a read time (C) of a structure having a read circuit in a single pixel.

In the arrangement of FIG. 6, not a photodiode using a pn junction but a MOS structure similar to a CCD is employed for the photoelectric conversion section. Then, as a voltage is applied to charge accumulation gate 71, optical signal charges are accumulated immediately below the gate 71. As for the direction of incident light, a rear surface irradiation method of making light enter from the surface opposite to the surface where the charge accumulation gate 71 and the transfer electrodes of the CCD memory are arranged can be used for the image sensor. The accumulated signal charges are transferred to an input transfer stage 81 of the CCD memory 80 as the voltage application to the charge accumulation gate 71 is stopped to turn on the adjacent input gate 72. The CCD memory 80 is a 4-phase drive CCD memory and signal charges are sequentially transferred to downstream image pickup transfer stages 81 as a transfer pulse is applied to A1 through A4 in FIG. 6 and the signal charges that are already transferred to the input transfer stages 81 are ultimately transferred to the final transfer stage 82 following the arrows shown in FIGS. 7A through 7C. A double twisted-pair electrode structure can typically be applied to the electrode arrangement. Note that the CCD memory 80 and other components are shielded from light to prevent any electric charges other than the signal charges being transferred from being generated.

In the overwrite mode (FIG. 7A), a signal charge that has made a full turn in the CCD memory 80 is detected and amplified as an electric signal by floating diffusion amp 92 and read out by a readout circuit 93 as readout gate 91 is turned on from the final transfer stage 82. The floating diffusion amp 92 and the readout circuit 93 are similar to those that are employed in ordinary CCDs and CMOS image sensors and hence will not be described here any further. The output of the readout circuit 93 is the output of the pixel and can be read out typically by way of a CMOS switching device.

A blooming suppression gate 94 may be connected to the input gate 72 so that, when the signal charges to be transferred exceed a predetermined value, only the excessive signal charges are transferred to a drain 95 by way of the blooming suppression gate 94. The predetermined value can be adjusted by setting the voltage to be applied to the blooming suppression gate 94. With this arrangement, any blooming that can arise when signal charges are transferred in the CCD memory 80 can be suppressed.

With the above-described operation, the image signals (signal charges) obtained with short intervals of image pickup timings can be temporarily stored in the CCD memory 80 and read out at a later time. The signal charges are made to make a full turn in the CCD memory 80 when they are read out and the input transfer stages 81 are reset so that the CCD memory 80 always stores the most recent image signals.

In an accumulation mode (FIG. 7B), the readout gate 91 is not turned on after a signal charge is made to full turn in the CCD memory 80 and transferred to the final transfer stage 82 but the CCD memory 80 is driven for a transfer operation. Then, as a result, the signal charges accumulated in the final transfer stage 82 are transferred to the input transfer stage 81. If the input gate 72 is turned on as described above at this time, the signal charges accumulated newly under the charge accumulation gate 71 can be transferred to the input transfer stage 81 and accumulated as integrated signal charges that are obtained by adding them to the signal charges already found in the input transfer stage 81. By repeating this operation, the electric charges at the elements (transfer stages) of the CCD memory 80 can be turned to integrated signal charges of a total of two cycle periods, which then can be sequentially transferred.

The operation at the read time after the accumulation mode (FIG. 7C) is similar to the corresponding operation in the overwrite mode. More specifically, in the accumulation mode, the signal charges that are made to turn around in the CCD memory 80 for a plurality of cycle periods and integrated and returned to the final transfer stage 82 are read out as in the overwrite mode. Note that the pixel can be reset by turning on reset gate 92, transferring the signal charges to the drain 95 and discharging them from the drain 95.

With this arrangement, when signals are amplified and read out on a pixel by pixel basis, operations in the overwrite mode and in the accumulation mode can be conducted by using a CCD memory 80 having the above-described configuration. Particularly, an image of a highly repetitive phenomenon can be picked up with a high S/N ratio by using the accumulation mode.

An image sensing operation in the accumulation mode is effective for measuring radioactive rays. In some measurement of radioactive rays, it is necessary to generate radioactive rays and measure (pickup an image of) the spatial distribution thereof. Of radioactive rays, neutron rays and γ rays are detected by means of a scintillator and the phenomenon where the fluorescent material of the scintillator is made to emit light by such radioactive rays is observed. Therefore, the distribution of emissions of light corresponds to the distribution of radioactive rays. Since a single emission of light is weak, it is not possible to sense an image of the emitted light with a high S/N ratio. In such a case, an image can be sensed with a high S/N ratio by periodically generating radioactive rays and making the cycle period of generation of radioactive rays agree with the cycle period of operation of the CCD memory. When radioactive rays are generated periodically according to a clock signal, such an operation can be particularly easily conducted by generating a transfer pulse of the CCD memory by utilizing the clock signal.

The above description can also be applied to experiments of observing the brain functions. In such an experiment, the fluorescent light generated from a brain due to an electric stimulus applied to the brain may be observed and an image thereof may be sensed. In such an instance, a single emission of fluorescent light last only for a short time and its intensity is also low. Then, an image of the fluorescent light can be sensed with a high S/N ratio by making the cycle period of electrically stimulating the brain and the cycle period of operation of the CCD memory agree with each other. It will be clear that a similar effect can be achieved for any repetitive phenomena other than the above examples.

The above-described operation in the accumulation mode is realized by arranging the input transfer stage and the final transfer stage side by side so that signal charges can also be transferred from the final transfer stage to the input transfer stage in a CCD memory in both of the above-described image sensor examples (FIGS. 1 and 6). However, it may be clear that a similar effect can be achieved by means of an arrangement other than the above arrangement where integrated signal charges formed by integrating a plurality of signal charges output from a photoelectric conversion section at different image pickup timings are temporarily stored (accumulated) in a pixel and image signals formed according to the integrated signal charges are output.

Figure 8:
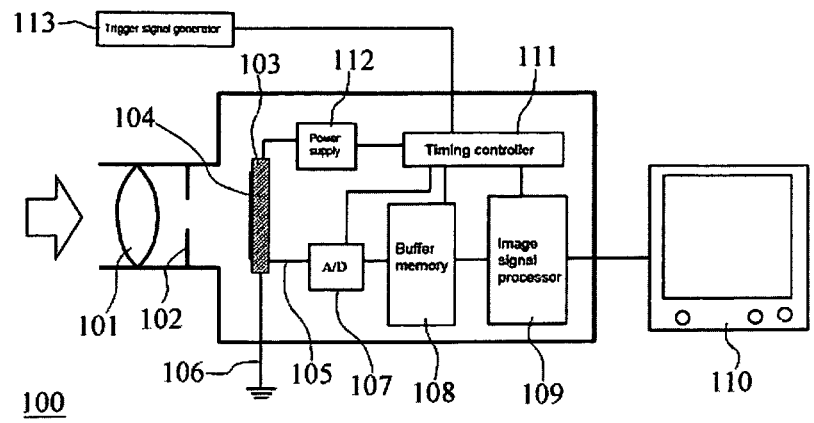
FIG. 8 is a schematic block diagram of an image pickup apparatus including an embodiment of image sensor according to the present invention.
Figure 9:
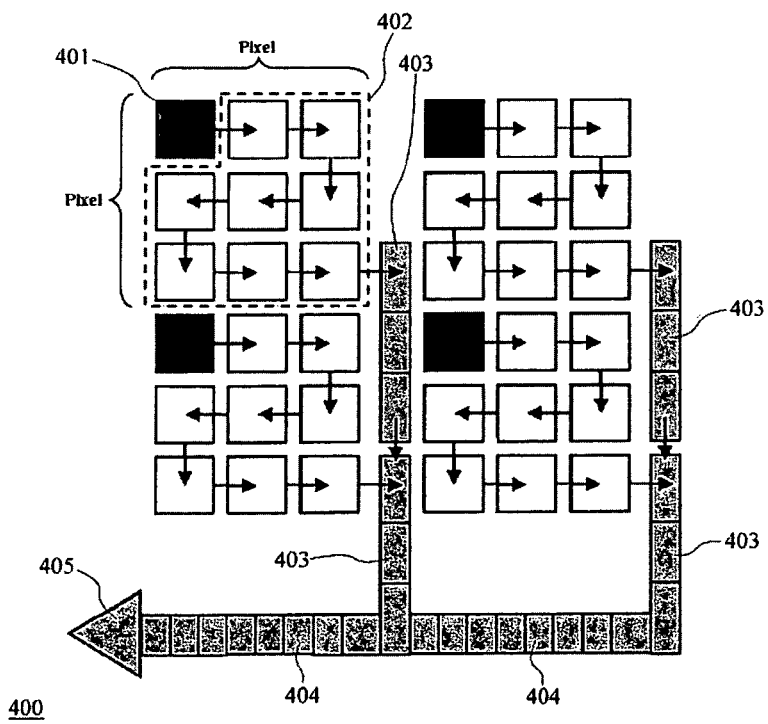
FIG. 9 is a schematic illustration of a known IS-type image sensor showing the first exemplar configuration.
Figure 10:
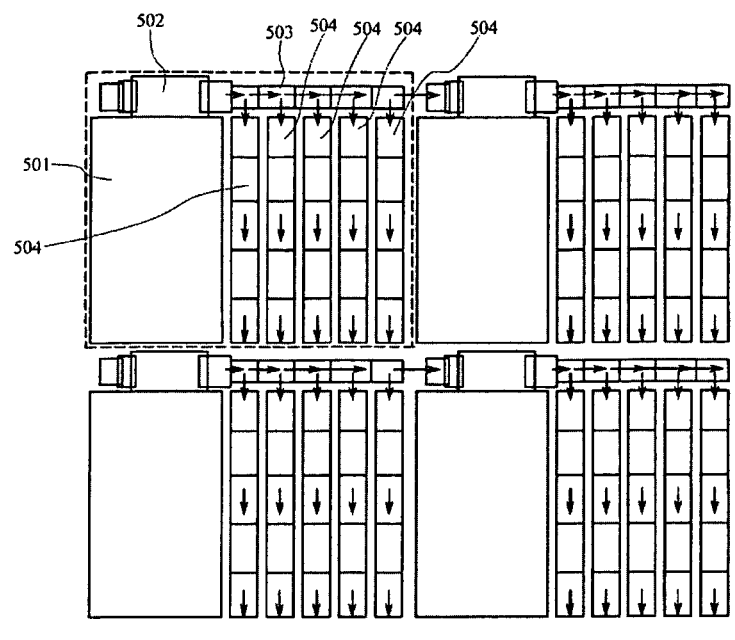
FIG. 10 is a schematic illustration of a known IS-type image sensor showing the second exemplar configuration.
Figure 11:
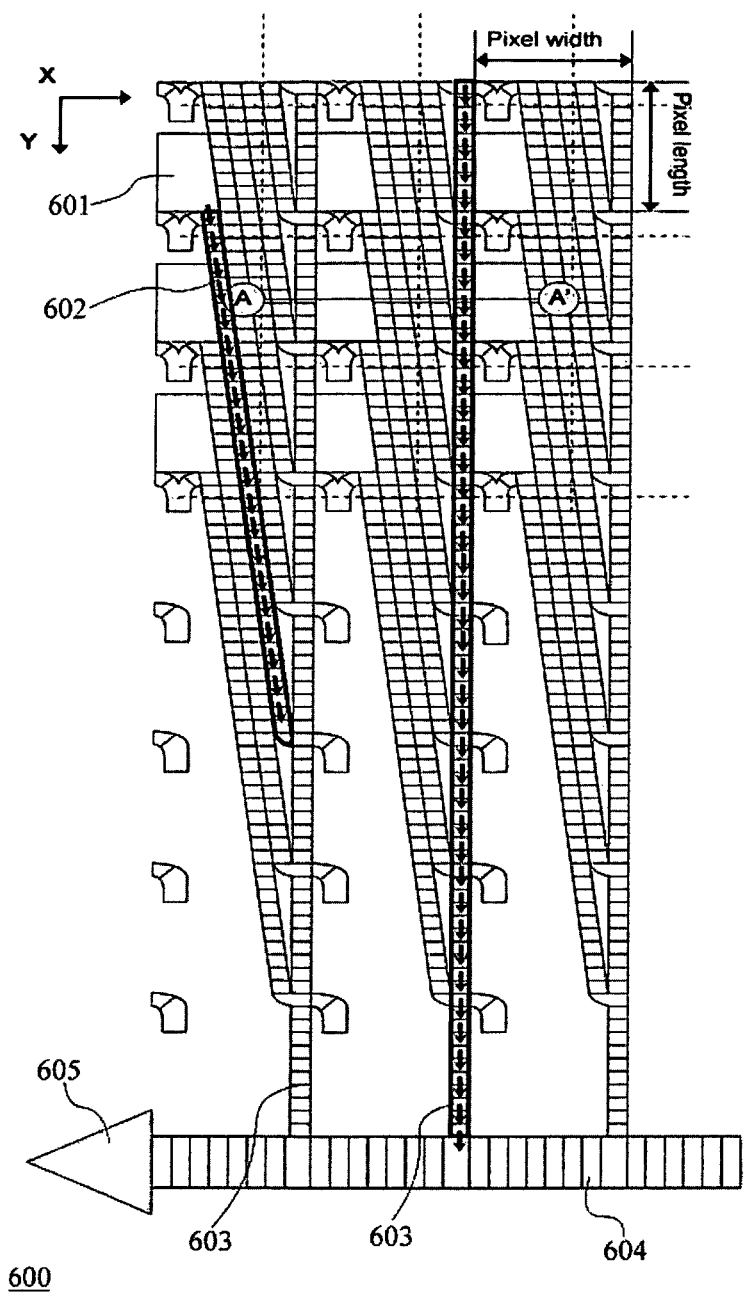
FIG. 11 is a schematic illustration of a known IS-type image sensor showing the third exemplar configuration.

FIG. 8 schematically illustrates an exemplar configuration that can be adapted to an image pickup apparatus by using such an image sensor. The object of which an image is to be picked up is found at the left side of the image pickup apparatus 100 in FIG. 8. Light from the object enters imaging plane 104 on an image sensor 103 having the above-described configuration by way of a lens (optical image forming system) 101 and a mechanical shutter 102. The lens 101 is so arranged that light from the object to be shot is focused on the imaging plane 104. The image sensor 103 operates exactly in the above-described manner and serially outputs image signals by way of a readout line 105. On the other hand, the electric charges (electric current) discharged to the drain flow to the earth side by way of a drain line 106.

The read out image signals are converted into digital signals by an AD converter 107 and then temporarily stored in a buffer memory 108. Thereafter, an image signal processor 109 prepares video signals of individual frames according to the image signals stored in the buffer memory 108 and outputs them. Monitor 110 displays the sensed image according to the video signals.

Timing controller 111 is employed to prepare and adjust a clock signal to be used to operate the image sensor 103. The clock signal is applied to the transfer electrodes of the CCD memory, the vertical CCD and the horizontal CCD and various gates. Power supply 112 is employed to operate as power source for driving the image sensor 103.

For the image sensor 103 to operate in the accumulation mode as described above, it is important to define the cycle period (for transferring a signal charge and making it to make a full turn in the CCD memory). For this purpose, a trigger signal generator 113 is connected to the timing controller 111. When the object of which an image is to be picked up is shot periodically according to a predetermined pulse, the pulse is input to the trigger signal generator 113. The timing controller 111 defines the cycle period of the CCD memory according to the pulse and prepares a transfer pulse for the CCD memory accordingly. If the phenomenon of which an image is to be picked up is not a periodical one, it will be clear that a similar effect can be achieved by defining the cycle period according to the intervals of shooting the phenomenon.

Additionally, the timing controller 111 prepares transfer pulses for the vertical CCD and the horizontal CCD and drives the image sensor 103 by using them.

It is also possible to measure the average brightness of the object of which an image is to be picked up and input the result of the measurement to the trigger signal generator 113. If such is the case, the timing controller 111 can be controlled in such a way that the overwrite mode is automatically selected for operation when the brightness is high, whereas the accumulation mode is automatically selected for operation when the brightness is low. As a result, it is possible conduct a high-speed image sensing operation regardless of the brightness of the object of which an image is to be picked up, in order to obtain good images.

In this way, the image sensor according to the present invention can be used for high-speed image sensing operations. It will be clear that an image pickup apparatus according to the present invention and having a configuration other than the above-described ones can also be used.

10, 103, 400, 500, 600 image sensor
20, 401, 501, 601 photoelectric conversion section
21, 72 input gate
30, 80, 402, 602 CCD memory (image signal recording elements)
31, 81 input transfer stage
32, 82 final transfer stage
33 output transfer stage
40 drain gate
41, 95 drain
42, 91 readout gate
50, 403, 504, 603 vertical CCD
60, 404, 503, 604 horizontal CCD
61, 405, 605 output section
71 charge accumulation gate
92 floating diffusion amp
93 readout circuit
94 blooming suppression gate
96 reset gate
100 image pickup apparatus
101 lens (optical image forming system)
102 mechanical shutter
104 imaging plane
105 readout line
106 drain line
107 AD converter
108 buffer memory
109 image signal processor
110 monitor
111 timing controller
112 power supply
113 trigger signal generator
301 first doped region
302 second doped region
303 channel stop region
305 A1 electrode (transfer electrode)
306 A2 electrode (transfer electrode)
311 B1 electrode (transfer electrode)
312 B2 electrode (transfer electrode)
313 B3 electrode (transfer electrode)
314 B4 electrode (transfer electrode)
321 C1 electrode (transfer electrode)

322 C2 electrode (transfer electrode)
323 C3 electrode (transfer electrode)

What is claimed is:

1. An image sensor comprising two-dimensionally arranged pixels for image sensing operations and outputting an image signal, each of the pixels having:
   a photoelectric conversion section that outputs light as signal charges;
   a charge coupled device (CCD) memory connected to the photoelectric conversion section comprising a plurality of transfer stages that accumulate a plurality of signal charges output from the photoelectric conversion section at a plurality of different image pickup timings in a series of image pickup operations,
   in which, an input transfer stage into which a signal charge is injected and a final transfer stage that is the final stage in a transfer direction of the CCD memory are arranged side by side, with four or more folding sections by which the transfer direction changes by 180 degrees, between the input transfer stage and the final transfer stage;
   the plurality of transfer stages being operative to respectively accumulate a plurality of integrated signal charges obtained by adding a plurality of signal charges output from the photoelectric conversion section at a plurality of different image pickup timings in another series of image pickup operations respectively to the plurality of signal charges accumulated in the image signal recording elements; and operative to output an image signal according to the plurality of integrated signal charges.

2. The sensor according to claim 1, wherein
   the CCD memory is a 4-phase CCD or a 3-phase CCD; and
   two wires are used, one for mutually connecting the transfer electrodes located respectively at the upstream sides in the transfer directions of two adjacent lines and the other for mutually connecting the transfer electrodes located respectively at the downstream sides in the transfer directions of the two adjacent lines connected via a corresponding one of the folding sections, out of the continuously arranged two transfer electrodes to be used on one of the adjacent two lines and the continuously arranged two transfer electrodes to be used on the other line;
   the two wires crossing each other between the two lines.

3. The sensor according to claim 2, wherein
   two pairs of the two adjacent lines connected via the corresponding folding section are formed, so that each of the lines is made parallel to each other, and two adjacent folding sections are made to face each other,
   a channel stop region is formed between the two adjacent folding sections,
   the two wires are used in the two adjacent folding sections, and the two wires cross each other on the channel stop region and each of the two wires is connected between the two pairs.

4. The sensor according to claim 1, wherein
   the channel of each transfer stage of the CCD memory includes:
   a first doped region that shows an impurity concentration selected so as to form a potential well in the channel when a predetermined voltage is applied to transfer electrodes formed on the channel by way of an oxide film and a second doped region that forms a potential well deeper than the first doped region when the voltage is applied;
   the direction directed from the first doped region to the second doped region at a transfer stage on one of two adjacent lines and the direction directed from the first doped region to the second doped region on the other line being opposite relative to each other; and
   the transfer stage at the tail end in the transfer direction of the upstream side line located at the upstream side of the transfer direction of one of the two adjacent lines and the transfer stage at the starting point in the transfer direction of the downstream side line located at the downstream side of the transfer direction of the other line being connected at a transfer stage having the first doped region at the side of the upstream side line and the second doped region at the side of the downstream side line.

5. The sensor according to claim 1, wherein
   the CCD memory has two different operation modes for transfer operations including:
   an overwrite mode for an operation of not transferring any signal charge from the final transfer stage to the input transfer stage; and
   an accumulation mode for an operation of transferring from the final transfer stage to the input transfer stage and subsequently injecting the signal charge output from the photoelectric conversion section into the input transfer stage.

6. The sensor according to claim 1, wherein
   a gate for discharging the signal charges exceeding a predetermined quantity to the outside of the CCD memory is connected to a transfer stage in the CCD memory.

7. An image pickup apparatus for acquiring image signals by means of the image sensor according to claim 1.

* * * * *